(12) United States Patent
Chen

(10) Patent No.: US 10,522,571 B2
(45) Date of Patent: Dec. 31, 2019

(54) ARRAY SUBSTRATE AND METHOD OF MANUFACTURING THE SAME

(71) Applicants: HKC CORPORATION LIMITED, Shuitian Village, Shiyan Sub-district (CN); CHONGQING HKC OPTOELECTRONICS TECHNOLOGY CO., LTD., Jieshi Town, Banan District (CN)

(72) Inventor: Yu-jen Chen, Jieshi Town (CN)

(73) Assignees: HKC CORPORATION LIMITED, Shuitian Village (CN); Chongqing HKC Optoelectronics Technology Co., Ltd, Banan District (CN)

(*) Notice: Subject to any disclaimer, the term of this patent is extended or adjusted under 35 U.S.C. 154(b) by 8 days.

(21) Appl. No.: 15/743,813

(22) PCT Filed: Jul. 26, 2017

(86) PCT No.: PCT/CN2017/094547
§ 371 (c)(1),
(2) Date: Jan. 11, 2018

(87) PCT Pub. No.: WO2018/196192
PCT Pub. Date: Nov. 1, 2018

(65) Prior Publication Data
US 2019/0139986 A1    May 9, 2019

(30) Foreign Application Priority Data
Apr. 24, 2017   (CN) .......................... 2017 1 0270720

(51) Int. Cl.
*H01L 27/14*  (2006.01)
*H01L 27/12*  (2006.01)
(Continued)

(52) U.S. Cl.
CPC .......... *H01L 27/124* (2013.01); *G02F 1/1368* (2013.01); *H01L 27/127* (2013.01);
(Continued)

(58) Field of Classification Search
CPC . H01L 21/124; H01L 27/127; H01L 27/1288; G02F 1/1362
See application file for complete search history.

(56) References Cited

U.S. PATENT DOCUMENTS

2007/0139597 A1* 6/2007 Shim ..................... G02F 1/1362
349/139
2009/0121232 A1   5/2009 Huh et al.
(Continued)

FOREIGN PATENT DOCUMENTS

| CN | 104600082 | 5/2015 |
| CN | 104779256 | 7/2015 |
| CN | 105870135 | 8/2016 |

OTHER PUBLICATIONS

International Search Report and Written Opinion Form PCT/ISA210, International Application No. PCT/CN2017/094547, International Filing Date Jul. 26, 2017, dated Jan. 29, 2018.

*Primary Examiner* — Phuc T Dang
(74) *Attorney, Agent, or Firm* — Bond Schoeneck & King, PLLC; George McGuire

(57) ABSTRACT

Disclosed are an array substrate and a method of manufacturing the array substrate. The method of manufacturing an array substrate includes: forming a first metal layer on a substrate, and etching the first metal layer; forming an insulating layer on the substrate and the first metal layer; forming an active layer and an ohmic contact layer successively on the insulating layer; etching the active layer and the ohmic contact layer; forming a second metal layer on the ohmic contact layer and the insulating layer, and etching the second metal layer; forming a protective layer on the second metal layer and the insulating layer; forming a photoresist layer on the protective layer, and performing exposure and development; and forming a transparent conducting layer directly on the color filter, and etching the transparent conducting layer to form a pixel electrode layer.

11 Claims, 3 Drawing Sheets

(51) Int. Cl.
*G02F 1/1368* (2006.01)
*H01L 29/417* (2006.01)
*G02F 1/1362* (2006.01)

(52) U.S. Cl.
CPC .... *H01L 27/1288* (2013.01); *H01L 29/41733* (2013.01); *G02F 2001/136222* (2013.01); *G02F 2201/123* (2013.01)

(56) References Cited

U.S. PATENT DOCUMENTS

2016/0071884 A1* 3/2016 Miyamoto .......... H01L 27/1251 257/59
2016/0320647 A1* 11/2016 Shin ..................... H01L 27/124

* cited by examiner

ARRAY SUBSTRATE AND METHOD OF MANUFACTURING THE SAME

CROSS-REFERENCE TO RELATED APPLICATIONS

This application is the United States National Phase Entry of PCT Application No. PCT/CN2017/094547 filed on Jul. 26, 2017, which claims priority to Chinese patent application No. 201710270720.3, filed on Apr. 24, 2017, the entire disclosure of each of which is incorporated herein by reference.

TECHNICAL FIELD

The present disclosure relates to the technical field of display panels, and for example, relates to an array substrate manufacturing process and an array substrate.

BACKGROUND

In an increasing number of liquid crystal panels, a technology of forming a color filter on array (COA) on an array of thin-film transistors (TFT) is used to improve the quality of image on a curved surface of a liquid crystal panel or simplify a structure of an upper plate, e.g., simplify a structure of an over coat (OC) of the upper plate of an In-Plane Switching (IPS) liquid crystal mode.

In the related art, a technology of manufacturing an array of a COA structure of the liquid crystal panel is as follows: after the manufacturing of gate electrodes, source electrodes and drain electrodes in a traditional COA structure are completed, a procedure of forming a first insulating layer is carried out; and then, steps of coating, exposing and developing a color filter layer (including a red photoresist, a green photoresist and a blue photoresist) are completed; and if the liquid crystal panel uses a white, red, green and blue (WRGB) technology, steps of coating, exposing and developing a transparent photoresist layer are also needed. A procedure of forming a second insulating layer is conducted after a structure of the color filter layer or the transparent photoresist layer is formed. Then a photoresist layer is coated, exposed using a mask with through holes, and developed and etched to remove the first insulating layer and the second insulating layer corresponding to the through holes and located above the array. The photoresist layer is removed to continue a process of manufacturing pixel electrodes (PEs).

In the industry of liquid crystal display (LCD), the production cost of TFT LCD remains large due to the complex processes and large device investment. With fierce market competition, reduction of the production cost of a display screen has become an inevitable development direction of the industry of flat-panel display. Therefore, there is need to develop a new technology of producing display panels, so as to reduce the production cost and increase the production efficiency.

SUMMARY

The present disclosure provides a method of manufacturing an array substrate, and an array substrate, so as to reduce production cost and increase production efficiency of display panels.

A method of manufacturing an array substrate includes following steps:

forming a first metal layer on a substrate, and etching the first metal layer to form gate electrodes of thin-film transistors;

forming an insulating layer on the substrate and the gate electrodes;

forming an active layer and an ohmic contact layer successively on the insulating layer;

etching the active layer and the ohmic contact layer to form channels of the thin-film transistors;

forming a second metal layer on the ohmic contact layer and the insulating layer, and etching the second metal layer to form source electrodes and drain electrodes of the thin-film transistors;

forming a protective layer on the second metal layer and the insulating layer;

forming a color filter layer on the protective layer and exposing and developing the color filter layer; and forming a transparent conducting layer directly on the color filter layer, and etching the transparent conducting layer to form a pixel electrode layer, wherein the color filter layer is in direct contact with the transparent conducting layer.

An array substrate includes:

a substrate;

gate electrodes of thin-film transistors located on the substrate;

an insulating layer located on the substrate and the gate electrodes;

an active layer located on the insulating layer;

an ohmic contact layer located on the active layer, wherein slots are arranged in the active layer and the ohmic contact layer and serve as channels of the thin-film transistors;

source electrodes and drain electrodes of the thin-film transistor are located on the ohmic contact layer;

a protective layer located on the source electrodes and the drain electrodes of the thin-film transistors, and on the insulating layer;

a color filter layer located on the protective layer and including filter layers; and a pixel electrode layer directly formed on the color filter layer.

An array substrate manufacturing process includes:

forming a first metal layer on a substrate, and etching the first metal layer to form gate electrodes of thin-film transistors;

forming an insulating layer on the substrate and the gate electrodes;

forming an active layer and an ohmic contact layer successively on the insulating layer;

etching the active layer and the ohmic contact layer to form channels of the thin-film transistors;

forming a second metal layer on the ohmic contact layer and the insulating layer, and etching the second metal layer to form source electrodes and drain electrodes of the thin-film transistors;

forming a protective layer on the second metal layer and the insulating layer;

forming a color filter layer on the protective layer, and exposing and developing the color filter layer; and forming a transparent conducting layer on the color filter layer, and etching the transparent conducting layer to form a pixel electrode layer, wherein the color filter layer is in contact with the transparent conducting layer, the forming a color filter layer on the protective layer, and exposing and developing the color filter layer includes:

coating a first organic photosensitive layer on the protective layer, and forming a first filter layer corresponding to pixels through masking, exposure and development;

coating a second organic photosensitive layer on the protective layer, and forming a second filter layer corresponding to the pixels through masking, exposure and development; and coating a third organic photosensitive layer on the protective layer, and forming a third filter layer corresponding to the pixels through masking, exposure and development, the color filter layer includes the first filter layer, the second filter layer and the third filter layer;

the first organic photosensitive layer is a red organic photosensitive layer, the second organic photosensitive layer is a green organic photosensitive layer, and the third organic photosensitive layer is a blue organic photosensitive layer;

the first filter layer is a red filter layer, the second filter layer is a green filter layer, and the third filter layer is a blue filter layer; and the red filter layer, the green filter layer and the blue filter layer are arranged in a same plane side by side.

BRIEF DESCRIPTION OF DRAWINGS

One or more embodiments are exemplarily described through corresponding pictures in drawings. Elements having the same reference number numeral in the drawings are represented as similar elements. Unless otherwise specified, figures in the drawings do not form a proportional limit.

DETAILED DESCRIPTION

To make technical solutions of the present disclosure more clear, the present disclosure will be described in detail below in combination with drawings and embodiments.

Figure 1:
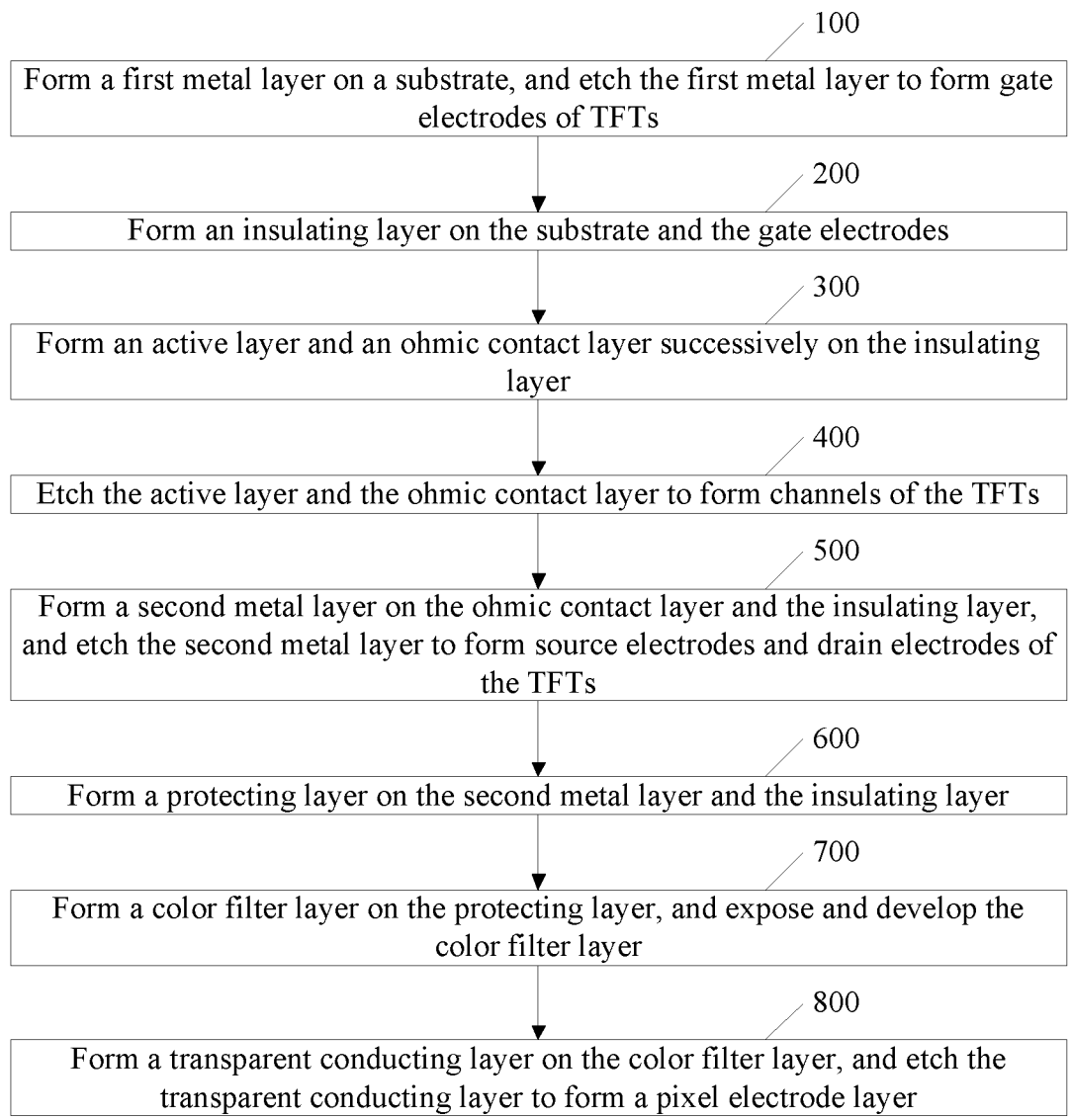
FIG. 1 is a schematic diagram illustrating steps of technological process of a method of manufacturing an array substrate according to an embodiment of the present disclosure.
Figure 2:
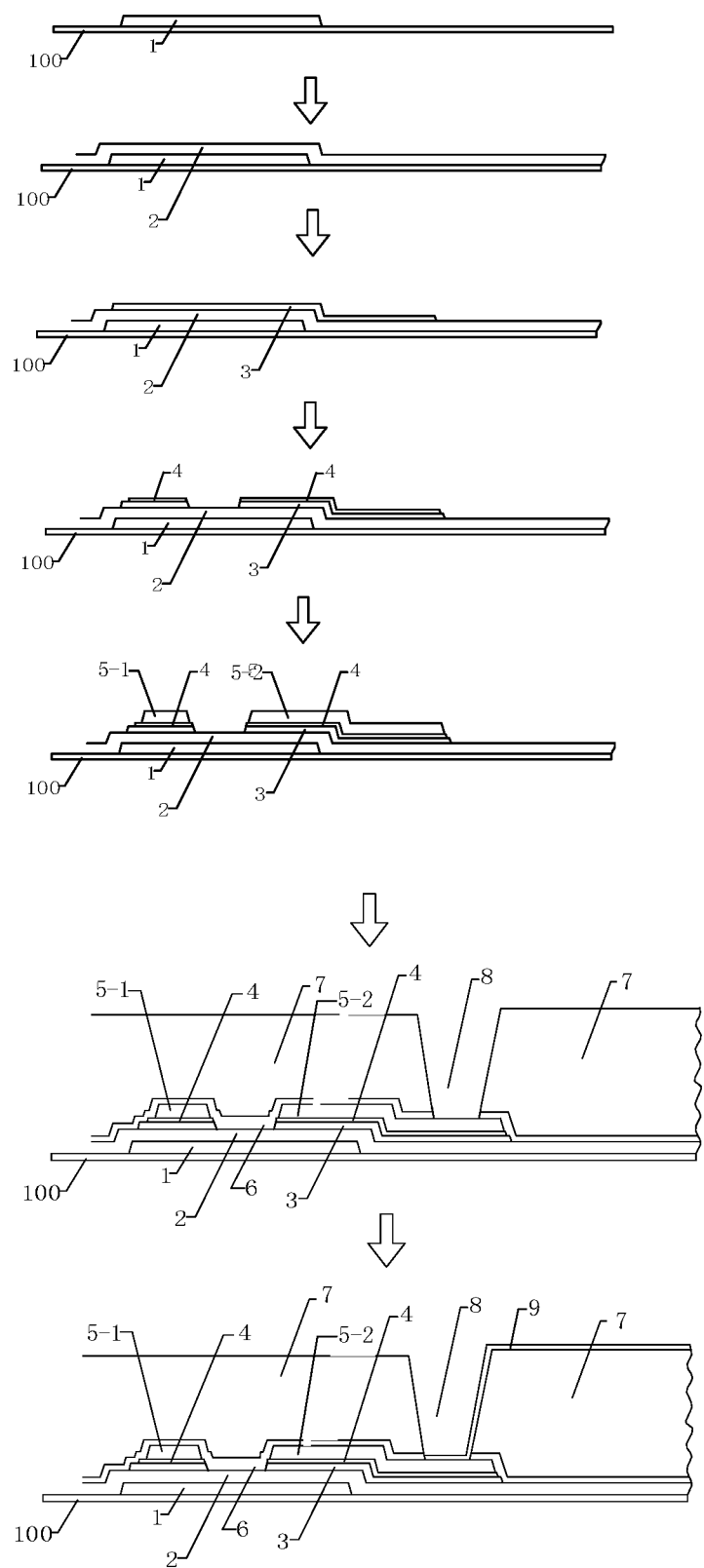
FIG. 2 is a flow chart illustrating a method of manufacturing an array substrate according to an embodiment of the present disclosure.

FIG. 1 is a schematic diagram illustrating steps of technological process of a method of manufacturing an array substrate according to a present embodiment of the present disclosure. FIG. 2 is a flow chart illustrating a method of manufacturing an array substrate according to the present embodiment of the present disclosure. As shown in FIG. 1 and FIG. 2, the present embodiment provides a method of manufacturing an array substrate, which includes steps described below.

In step 100, a first metal layer is formed on a substrate 100 and the first metal layer is etched to form gate electrodes 1 of TFTs.

In step 200, an insulating layer 2 is formed on the substrate 100 and the gate electrodes 1.

In the step 300, an active layer 3 and an ohmic contact layer 4 are successively formed on the insulating layer 2.

In the step 400, the active layer 3 and the ohmic contact layer 4 are etched to form channels of the TFTs.

In the step 500, a second metal layer is formed on the ohmic contact layer 4 and the insulating layer 2, and the second metal layer is etched to form source electrodes 5-1 and drain electrodes 5-2 of the TFTs. FIG. 2 illustrates an example in which the source electrode 5-1 is at left side and the drain electrode 5-2 is at right side. Alternatively, the drain electrode 5-2 may be at right side and the source electrode 5-1 may be at left side.

In step 600, a protective layer 6 is formed on the second metal layer and the insulating layer 2.

In step 700, a color filter layer 7 is formed on the protective layer 6, and the color filter layer is exposed and developed.

In step 800, a transparent conducting layer is formed on the color filter layer 7, and the transparent conducting layer is etched to form a pixel electrode layer; the color filter layer 7 is in direct contact with the transparent conducting layer.

Optionally, in the step 100, the step of forming a first metal layer on a substrate 100, and etching the first metal layer to form gate electrodes 1 of TFTs includes: cleaning the substrate 100, forming a film, coating a photoresist, exposure, development, etching, and removing a photoresist.

In the process of cleaning the substrate 100, one or more foreign bodies on the substrate 100 are removed.

In the process of forming a film, a metal film, i.e., a first metal layer, is formed through sputtering deposition on a surface of the cleaned substrate 100.

In the process of coating a photoresist, a layer of photoresist is uniformly coated on the formed first metal layer.

In the process of exposure, the photoresist is exposed by ultraviolet rays which penetrate a mask to irradiate the photoresist on the first metal layer.

In the process of development, an exposed part of the photoresist is dissolved in a developing solution; a remaining part of a pattern of the photoresist presents a required shape.

In the process of etching, the substrate is immersed into a corresponding etching solution or etching gas to etch off the first metal layer uncovered by the photoresist.

In the process of removing the photoresist, residual photoresist is removed, and the first metal layer with the required shape is reserved to form scan lines, gate electrodes 1 of TFTs, and common electrodes.

Optionally, in the step 500, a step of forming a second metal layer on the ohmic contact layer 4 and the insulating layer 2, and etching the second metal layer to form source electrodes 5-1 and drain electrodes 5-2 of the TFTs includes: forming a film, coating a photoresist, exposure, development, etching, and removing a photoresist.

In the process of forming a film, a metal film, i.e., a second metal layer, is formed through sputtering deposition on surfaces of the ohmic contact layer and the insulating layer.

In the process of coating a photoresist, a layer of photoresist is uniformly coated on the formed second metal layer.

In the process of exposure, the photoresist is exposed by ultraviolet rays which penetrate a mask and irradiate the photoresist on the second metal layer.

In the step of development, an exposed part of the photoresist is dissolved in a developing solution; a remaining part of a pattern of the photoresist presents a required shape.

In the process of etching, the substrate 100 is immersed into a corresponding etching solution or etching gas to etch off the second metal layer uncovered by the photoresist.

In the process of removing the photoresist, residual photoresist is removed, and the second metal layer with the required shape is reserved to form data lines and to define the source electrodes 5-1 and drain electrodes 5-2 of the TFTs on the ohmic contact layer.

Optionally, in the step 700, forming a color filter layer 7 on the protective layer 6 and exposing and developing the color filter layer 7 includes steps described below.

A first organic photosensitive layer is coated on the protective layer 6, and a first filter layer corresponding to pixels is formed through masking, exposure and development;

A second organic photosensitive layer is coated on the protective layer 6, and a second filter layer corresponding to the pixels is formed through masking, exposure and development; and A third organic photosensitive layer is coated on the protective layer 6, and a third filter layer corresponding to the pixels is formed through masking, exposure and development.

The color filter layer includes the first filter layer, the second filter layer and the third filter layer.

Optionally, in above steps in the present embodiment, the first organic photosensitive layer is a red organic photosensitive layer, the second organic photosensitive layer is a green organic photosensitive layer, and the third organic photosensitive layer is a blue organic photosensitive layer; the first filter layer is a red filter layer, the second filter layer is a green filter layer, and the third filter layer is a blue filter layer. Through the above three steps (in no particular order), a color filter layer may be formed. The color filter layer is the color filter layer in the present embodiment. The red filter layer, the green filter layer and the blue filter layer may be arranged in a same plane side by side.

Optionally, if the display panel is a liquid crystal panel using a WRGB technology, the color filter layer 7 is a combination of the color filter layer and a transparent filter layer (not shown). In the step 700, a step of forming a color filter layer 7 on the protective layer 6, and exposing and developing the color filter layer may include steps described below.

A red organic photosensitive layer is coated on the protective layer 6, and a red filter layer corresponding to pixels is formed through masking, exposure and development.

A green organic photosensitive layer is coated on the protective layer 6, and a green filter layer corresponding to the pixels is formed through masking, exposure and development.

A blue organic photosensitive layer is coated on the protective layer 6, and a blue filter layer corresponding to the pixels is formed through masking, exposure and development.

A transparent organic photosensitive layer is coated on the protective layer 6, and a transparent filter layer corresponding to the pixels is formed through masking, exposure and development.

In other words, in the present embodiment, the color filter layer includes a red filter layer, a green filter layer, a blue filter layer and a transparent filter layer. The red filter layer, the green filter layer, the blue filter layer and the transparent filter layer may be arranged in a same plane side by side.

Optionally, in the step 800, a mask with through holes is used for exposing, developing and etching the color filter layer 7; to remove the insulating layer 2 corresponding to regions of the through holes of the mask so as to form at least one opening 8. The first metal layer and the second metal layer corresponding to the regions of the through holes of the mask may be exposed outside to form an array; or, the protective layer 6 corresponding to the regions of the through holes of the mask so as to form at least one opening 8. The second metal layer corresponding to the through holes of the mask may be exposed outside to form an array. In the method of manufacturing pixel electrodes, a transparent conducting layer 9 is formed on the color filter layer 7, and the transparent conducting layer 9 is exposed, developed and etched. The transparent conducting layer 9 is coupled to at least one of the first metal layer and the second metal layer through the openings 8, so as to form a pixel electrode layer.

In above embodiments, after the color filter layer 7 is coated, exposed and developed, instead of forming the second insulating layer and even exposing, developing and removing the photoresist layer, a formed color filter layer is used as a mask for etching, so as to remove the insulating layer 2 and the protective layer 6 corresponding to the regions of the through holes of the mask; and a subsequent process of manufacturing pixel electrodes follows. In the method of manufacturing an array substrate of the present embodiment, a structure and a production procedure of the array substrate are simplified, thereby increasing efficiency and productivity of production lines, saving expense of production devices and the mask and reducing production cost.

Figure 3:
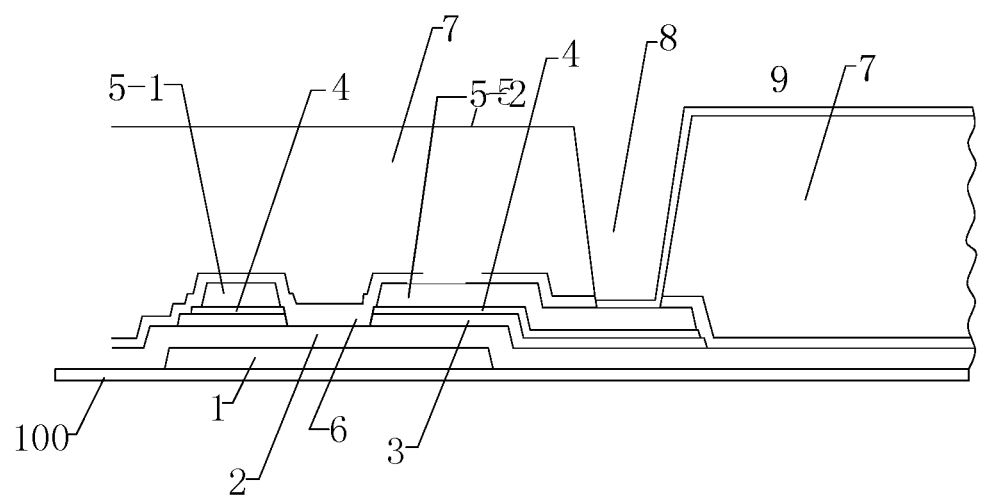
FIG. 3 is a longitudinal sectional view illustrating an array substrate according to an embodiment of the present disclosure.

FIG. 3 is a longitudinal sectional view illustrating an array substrate according to an embodiment of the present disclosure. As shown in FIG. 3, the present embodiment provides an array substrate, including: a substrate 100, a gate electrode 1 of a thin-film transistor, an insulating layer 2, an active layer 3, an ohmic contact layer 4, a source electrode 5-1 and a drain electrode 5-2 of the thin-film transistor, a protective layer 6, a color filter layer 7 and a pixel electrode layer.

The gate electrode 1 of the thin-film transistor is located on the substrate 100.

The insulating layer 2 is located on the substrate 100 and the gate electrode 1.

The active layer 3 is located on the insulating layer 2.

The ohmic contact layer 4 is located on the active layer 3. A slot is arranged in the active layer and the ohmic contact layer and serves as a channel of the thin-film transistor.

The source electrode 5-1 and the drain electrode 5-2 of the thin-film transistor are located on the ohmic contact layer.

The protective layer 6 is located on the source electrode 5-1 and the drain electrode 5-2 of the thin-film transistor, and on the insulating layer 2.

The color filter layer 7 is located on the protective layer 6, and the color filter layer 7 includes a plurality of filter units.

The pixel electrode layer is directly formed on the color filter layer.

Optionally, in the array substrate of the present embodiment, the color filter layer 7 includes red filter layers, green filter layers and blue filter layers which are arranged in a same plane. The red filter layers, the green filter layers and the blue filter layers are the above filter units.

Optionally, if the display panel is a liquid crystal panel using a WRGB technology, the color filter layer 7 is a combination of the color filter layer and a transparent filter layer (not shown). The color filter layer may include red filter layers, green filter layers, blue filter layers and transparent filter layers which are arranged in a same plane.

Optionally, an opening 8 is located in the color filter layer 7. The color filter layer 7 is exposed, developed and etched, and the insulating layer 2 corresponding to a region of the through hole of the mask is removed, so as to form the opening 8. The first metal layer and the second metal layer corresponding to regions of through holes of the mask plate may be exposed outside to form an array. Alternatively, the color filter layer 7 is exposed, developed and etched, and the protective layer 6 corresponding to a region of a through hole of the mask is removed to form the opening 8. The second metal layer corresponding to regions of through holes of the mask may be exposed outside to form an array. The pixel electrode includes a transparent conducting layer 9. The transparent conducting layer 9 is exposed, developed and etched, and is coupled to at least one of the first metal layer and the second metal layer via the opening 8 to form the pixel electrode layer.

The present embodiment provides a display panel, including: a backlight module, a first substrate, a second substrate and a liquid crystal layer.

The backlight module is configured to provide an illumination source.

The first substrate includes: a substrate, gate electrodes of thin-film transistors, an insulating layer, an active layer, an ohmic contact layer, source electrodes and drain electrodes of the thin-film transistors, a protective layer, a color filter layer, a pixel electrode layer, a first alignment film and a first polarizer.

The gate electrodes of the thin-film transistors are located on a surface at a first side of the substrate.

The insulating layer is located on the substrate and the gate electrodes.

The active layer 3 is located on the insulating layer.

The ohmic contact layer is located on the active layer. Slots are arranged in the active layer and the ohmic contact layer and serve as channels of the thin-film transistors.

The source electrodes and the drain electrodes of the thin-film transistors are located on the ohmic contact layer.

The protective layer is located on the source electrodes and the drain electrodes of the thin-film transistors, and on the insulating layer.

The color filter layer is located on the protective layer.

The pixel electrode layer is directly formed on the color filter layer.

The first alignment film is located on the pixel electrode layer.

The first polarizer is arranged on a second side of the substrate.

The second substrate and the first substrate are buckled.

The liquid crystal layer fills between the first substrate and the second substrate.

Optionally, the display panel provided in the present embodiment further includes a black matrix layer, a second alignment film and a second polarizer.

The black matrix layer is arranged on an inner side of the second substrate.

The second alignment film is arranged on the black matrix layer. The second polarizer is arranged on an outer side of the second substrate.

Optionally, in the display panel provided in the present embodiment, the color filter layer may include red filter layers, green filter layers and blue filter layers which are arranged in a same plane; or, the color filter layer includes red filter layers, green filter layers, blue filter layers and transparent light-filtering layers which are arranged in a same plane.

As to the display panel of the present embodiment, after the color filter layer is coated, exposed and developed, instead of forming the second insulating layer, and even exposing, developing and removing the photoresist layer, the formed color filter layer is used as a mask for etching so as to remove the insulating layer and the protective layer corresponding to the regions of the through holes; and a subsequent process of manufacturing pixel electrode follows. In the display panel of the present embodiment, a structure and a production procedure of the array substrate are simplified, thereby increasing efficiency and productivity of production lines, saving expense of production devices and the mask and reducing production cost.

What is claimed is:

1. A method of manufacturing an array substrate, comprising:
   forming a first metal layer on a substrate, and etching the first metal layer to form a plurality of gate electrodes of a plurality of thin-film transistors;
   forming an insulating layer on the substrate and the gate electrodes;
   forming an active layer and an ohmic contact layer successively on the insulating layer;
   etching the active layer and the ohmic contact layer to form a plurality of channels of the thin-film transistors;
   forming a second metal layer on the ohmic contact layer and the insulating layer, and etching the second metal layer to form a plurality of source electrodes and a plurality of drain electrodes of the thin-film transistors;
   forming a protective layer on the second metal layer and the insulating layer;
   forming a color filter layer on the protective layer, and exposing and developing the color filter layer; and
   forming a transparent conducting layer directly on the color filter layer, and etching the transparent conducting layer to form a pixel electrode layer, wherein the color filter layer is in direct contact with the transparent conducting layer, the pixel electrode layer is coupled to the source electrodes and the drain electrodes of the second metal layer via a plurality of openings,
   wherein the forming a color filter layer on the protective layer, and exposing and developing the color filter layer comprises:
   coating a first organic photosensitive layer on the protective layer, and forming a first filter layer corresponding to pixels through masking, exposure and development;
   coating a second organic photosensitive layer on the protective layer, and forming a second filter layer corresponding to the pixels through masking, exposure and development; and
   coating a third organic photosensitive layer on the protective layer, and forming a third filter layer corresponding to the pixels through masking, exposure and development, and
   wherein the color filter layer comprises the first filter layer, the second filter layer and the third filter layer.

2. The method of manufacturing according to claim 1, wherein the forming a first metal layer on a substrate, and etching the first metal layer to form a plurality of gate electrodes of a plurality of thin-film transistor comprises:
   a step of cleaning the substrate, which comprises removing one or more foreign bodies on the substrate;
   a step of forming a film, which comprises forming a metal film on a surface of the cleaned substrate through sputtering deposition, wherein the metal film is a first metal layer;
   a step of coating a photoresist, which comprises coating a layer of photoresist uniformly on the formed first metal layer;
   a step of exposure, which comprises exposing the photoresist by ultraviolet rays which penetrate a mask and irradiate the photoresist on the surface of the first metal layer;

a step of development, which comprises dissolving an exposed part of the photoresist in a developing solution, wherein a remaining part of a pattern of the photoresist presents a required shape;

a step of etching, which comprises immersing the substrate into a corresponding etching solution or etching gas to etch off the first metal layer uncovered by the photoresist; and a step of removing the photoresist, which comprises removing residual photoresist and reserving the first metal layer with the required shape to form a plurality of scan lines, the gate electrodes of the thin-film transistors, and a plurality of common electrodes.

3. The method of manufacturing according to claim 1, wherein the forming a second metal layer on the ohmic contact layer and the insulating layer, and etching the second metal layer to form a plurality of source electrode and a plurality of drain electrode of the thin-film transistors comprises:

a step of forming a film, which comprises forming a metal film on surfaces of the ohmic contact layer and the insulating layer through sputtering deposition, wherein the metal film is a second metal layer;

a step of coating a photoresist, which comprises coating a layer of photoresist uniformly on the formed second metal layer;

a step of exposure, which comprises exposing the photoresist by ultraviolet rays which penetrate a mask and irradiate the photoresist on the surface of the second metal layer;

a step of development, which comprises dissolving an exposed part of the photoresist in a developing solution, wherein a remaining part of a pattern of the photoresist presents a required shape;

a step of etching, which comprises immersing the substrate into a corresponding etching solution or etching gas to etch off the second metal layer uncovered by the photoresist; and a step of removing the photoresist, which comprises removing residual photoresist and reserving the second metal layer with the required shape to form a plurality of data lines and to define the source electrodes and the drain electrodes of the thin-film transistors on the ohmic contact layer.

4. The method of manufacturing according to claim 1, wherein the forming a color filter layer on the protective layer, and exposing and developing the color filter layer further comprises:

coating a transparent organic photosensitive layer on the protective layer, and forming a transparent filter layer corresponding to the pixels through masking, exposure and development, wherein the color filter layer further comprises the transparent filter layer.

5. The method of manufacturing according to claim 4, wherein the first organic photosensitive layer is a red organic photosensitive layer, the second organic photosensitive layer is a green organic photosensitive layer, and the third organic photosensitive layer is a blue organic photosensitive layer; and the first filter layer is a red filter layer, the second filter layer is a green filter layer, and the third filter layer is a blue filter layer.

6. The method of manufacturing according to claim 5, wherein the red filter layer, the green filter layer and the blue filter layer are arranged in a same plane side by side.

7. The method of manufacturing according to claim 4, wherein the first filter layer, the second filter layer, the third filter layer and the transparent filter layer are arranged in a same plane side by side.

8. The method of manufacturing according to claim 7, wherein the first organic photosensitive layer is a red organic photosensitive layer, the second organic photosensitive layer is a green organic photosensitive layer, and the third organic photosensitive layer is a blue organic photosensitive layer; and the first filter layer is a red filter layer, the second filter layer is a green filter layer, and the third filter layer is a blue filter layer.

9. The method of manufacturing according to claim 1, wherein the forming a color filter layer on the protective layer, and exposing and developing the color filter layer comprises:

exposing, developing and etching the color filter layer using a mask with a plurality of through holes; and removing the protective layer corresponding to regions of the through holes of the mask to form the openings, so as to expose the second metal layer.

10. The method of manufacturing according to claim 9, wherein the forming a transparent conducting layer on the color filter layer, and etching the transparent conducting layer to form a pixel electrode layer comprises:

forming a transparent conducting layer on the color filter layer, and exposing, developing and etching the transparent conducting layer; and coupling the transparent conducting layer to the second metal layer via the openings to form the pixel electrode layer.

11. A method of manufacturing an array substrate, comprising:

forming a first metal layer on a substrate and etching the first metal layer to form a plurality of gate electrodes of a plurality of thin-film transistors;

forming an insulating layer on the substrate and the gate electrodes;

forming an active layer and an ohmic contact layer successively on the insulating layer;

etching the active layer and the ohmic contact layer to form a plurality of channels of the thin-film transistors;

forming a second metal layer on the ohmic contact layer and the insulating layer, and etching the second metal layer to form a plurality of source electrodes and a plurality of drain electrodes of the thin-film transistors;

forming a protective layer on the second metal layer and the insulating layer;

forming a color filter layer on the protective layer, and exposing and developing the color filter layer;

forming a transparent conducting layer on the color filter layer, and etching the transparent conducting layer to form a pixel electrode layer, wherein the color filter layer is in contact with the transparent conducting layer, the pixel electrode layer is coupled to the source electrodes and the drain electrodes of the second metal layer via a plurality of openings, wherein the forming a color filter layer on the protective layer, and exposing and developing the color filter layer comprises:

coating a first organic photosensitive layer on the protective layer, and forming a first filter layer corresponding to pixels through masking, exposure and development;

coating a second organic photosensitive layer on the protective layer, and forming a second filter layer corresponding to the pixels through masking, exposure and development; and coating a third organic photosensitive layer on the protective layer, and forming a third filter layer corresponding to the pixels through masking, exposure and development, and wherein the color filter layer comprises the first filter layer, the second filter layer and the third filter layer;

the first organic photosensitive layer is a red organic photosensitive layer, the second organic photosensitive layer is a green organic photosensitive layer, and the third organic photosensitive layer is a blue organic photosensitive layer;

the first filter layer is a red filter layer, the second filter layer is a green filter layer, and the third filter layer is a blue filter layer; and the red filter layer, the green filter layer and the blue filter layer are arranged in a same plane side by side.

* * * * *